United States Patent [19]

Martin

[11] Patent Number: 5,412,313
[45] Date of Patent: May 2, 1995

[54] METHOD TO REDUCE TEST VECTORS/TEST TIME IN DEVICES USING EQUIVALENT BLOCKS

[75] Inventor: William C. Martin, Carrollton, Tex.

[73] Assignee: VLSI Technology, Inc., San Jose, Calif.

[21] Appl. No.: 959,179

[22] Filed: Oct. 9, 1992

Related U.S. Application Data

[63] Continuation of Ser. No. 643,599, Jan. 22, 1991, abandoned.

[51] Int. Cl.[6] ............................................. G01R 31/02
[52] U.S. Cl. ............................ 324/158.1; 324/760; 371/25.1; 371/22.4
[58] Field of Search .......... 324/158 R, 158 T, 158 F, 324/72.5, 760, 761; 371/22.1, 22.3, 22.4, 68, 25.1; 437/8

[56] References Cited

U.S. PATENT DOCUMENTS

| | | | |
|---|---|---|---|
| 4,233,682 | 11/1980 | Liebergot et al. | 371/68.1 |
| 4,245,344 | 1/1981 | Richter | 371/68.1 |
| 4,395,767 | 7/1983 | Van Bruns et al. | 371/25.1 |
| 4,500,993 | 2/1985 | Jacobson | 371/27 |
| 4,658,400 | 4/1987 | Brown et al. | 371/22.1 |
| 4,744,061 | 5/1988 | Takamae et al. | 371/68.1 |
| 4,745,542 | 5/1988 | Baba et al. | 371/68.3 |
| 4,792,955 | 12/1988 | Johnson et al. | 371/68.1 |
| 4,801,870 | 1/1989 | Eichelberger et al. | 371/25.1 |
| 4,817,093 | 3/1989 | Jacobs et al. | 371/22.3 |
| 4,843,608 | 6/1989 | Fu et al. | 371/68.1 |
| 4,855,670 | 8/1989 | Green | 324/158 R |
| 4,862,399 | 8/1989 | Freeman | 371/27.1 |
| 4,907,230 | 3/1990 | Heller et al. | 371/22.1 |
| 4,933,908 | 6/1990 | Byers et al. | 371/68.1 |
| 4,973,904 | 11/1990 | Sonnek | 324/158 T |
| 4,982,403 | 1/1991 | Du Chene | 371/22.4 |
| 5,001,418 | 3/1991 | Posse et al. | 324/158 R |
| 5,086,271 | 2/1992 | Haill et al. | 324/158 F |

FOREIGN PATENT DOCUMENTS

| | | |
|---|---|---|
| 0279738 | 8/1988 | European Pat. Off. . |
| 0315475 | 5/1989 | European Pat. Off. . |
| 0388790 | 9/1990 | European Pat. Off. . |
| 0400179 | 12/1990 | European Pat. Off. . |

*Primary Examiner*—Vinh Nguyen
*Attorney, Agent, or Firm*—Burns, Doane, Swecker & Mathis

[57] ABSTRACT

A method and apparatus for testing the functionality of a circuit are disclosed which reduce the number of vectors required to simulate and test cells having, for example, similar functions. By using a number of vectors which is independent of the number of cells or blocks in the circuit, the need for multiple test modes is reduced such that the time and cost associated with a functionality test can be reduced.

19 Claims, 1 Drawing Sheet

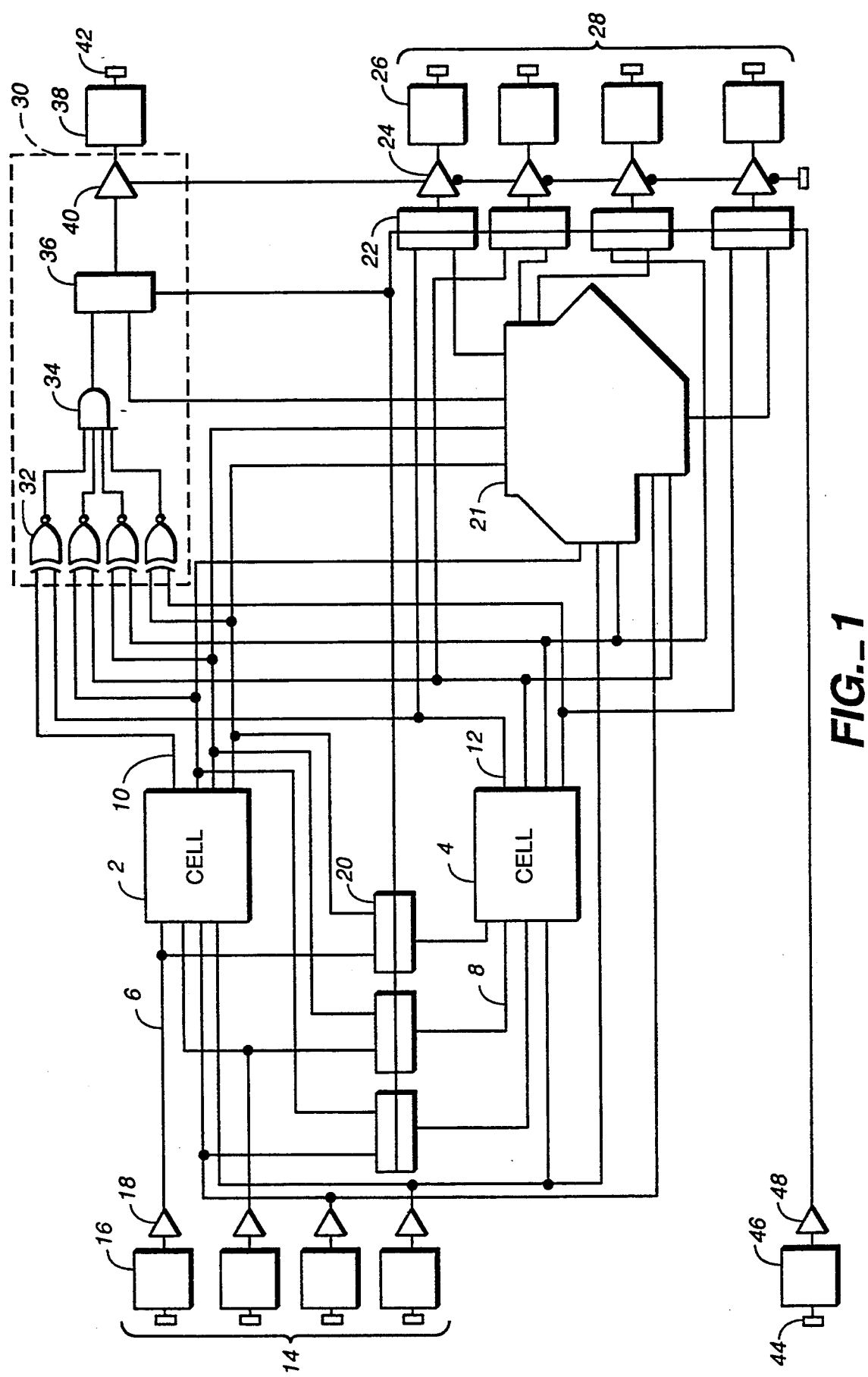
FIG._1

METHOD TO REDUCE TEST VECTORS/TEST TIME IN DEVICES USING EQUIVALENT BLOCKS

This application is a continuation of application Ser. No. 07/643,559, filed Jan. 22, 1991, now abandoned.

BACKGROUND OF THE INVENTION

1. Field of the Invention

The present invention generally relates to the design of electronic circuits such as integrated circuits. More particularly, the present invention relates to the functionality testing of electronic circuits during circuit design to ensure correct operation.

2. State of the Art

It is known to test the functionality of a circuit for correct operation. In practice, integrated circuits can be any of several silicon technologies, such as CMOS, Bipolar, GaAs, and so forth.

Integrated circuit manufacturers have developed methods such as gate array, cell and programmable logic based methods to reduce design time. Instead of custom designing a circuit by each individual transistor, which increases design time, most manufacturers have designed and characterized many basic, or primitive, functional blocks that can be used to build larger functional blocks. As this technique has evolved, larger functional blocks such as RAMs, ROMs, ALUs, and so forth have also been developed and characterized as primitive blocks.

Since most of these functional blocks can be of various characteristics (i.e., variable number of bits, number of words, speed, and so forth), many manufacturers have created compilers whereby gate array and cell-based designs can be composed from characterized functional blocks. These advancements coupled with Computer Aided Design (CAD) advancements have led customers to the design of their own integrated circuits for their specific application, known as Application Specific Integrated Circuits (ASICs), to further reduce design time.

Following the design of an application specific integrated circuit, it is desirable to test the functionality of the circuit for compliance with predetermined operational criteria. In order to test the functionality of a circuit formed, for example, on a semiconductor chip, the circuit is initially simulated in a test environment wherein test vectors are run for each cell. Simulation is performed to debug a circuit design and remove errors, such as errors in logic and timing. Following circuit simulation, test vectors are again used during manufacture to ensure proper implementation of, for example, a semiconductor wafer or assembled IC.

A test vector is a series of input signals to a given cell which will produce a known output or outputs from the cell. Accordingly, through the input of test vectors and by checking the outputs of the cell, the functionality of the cell can be determined.

Typically, an ASIC of the large scale integration or very large integration class will include a number of very similar and/or identical cells. For example, a given circuit may include a number of the same RAMs, two or more of the same multipliers, two or more of the same adders, and so forth. To test the functionality of the circuit, a test mode is normally initiated wherein each cell is sequentially isolated. Test vectors are then applied to each isolated cell one at a time. After testing the functionality of a given cell, test vectors are applied as stimuli for a subsequent cell, which may be similar or identical to a previously tested cell. Thus, when testing the functionality of a circuit having a number of similar or identical cells, the test vectors associated with these cells are run independently for each identical cell.

One characteristic of an integrated circuit is that the outputs of any given cell may go either to output pins of the circuit (e.g., chip output pins) or, to other internal cells of the circuit. The cells which are directly connected to output pins of a circuit may have their outputs tested relatively easily. However, isolation of those cells which are internally connected to other cells requires the use of additional circuitry to permit independent testing during manufacture. Accordingly, the requirement of independently run test vectors for each identical cell of a circuit layout not only increases the simulation time and number of test vectors required, but in addition, the hardware required to independently isolate each of the cells for independent testing increases the cost of the circuit.

For example, if a given cell requires 10,000 vectors to test its functionality, a minimum of 20,000 vectors would be required to test two identical cells contained in the circuit. The running of these 20,000 vectors directly impacts the design simulation time (i.e., a minimum of two times the time required for testing one cell). Further, some of the logic used for isolating a cell will have relatively slow speeds. For example, large multiplexers are typically required to permit independent isolation of each cell, and these large multiplexers can cause timing problems within the circuit during use of the chip.

Accordingly, there currently exists a need for a technique that will reduce the simulation time and number of test vectors required for testing the functionality of a circuit such that the time and cost of designing and testing the circuit can be reduced.

SUMMARY OF THE INVENTION

In accordance with the present invention, a method and apparatus for testing the functionality of a circuit is disclosed. In accordance with a preferred method and apparatus, the number of vectors required to simulate and test circuit components, such as cells, having similar functions or megafunctions is reduced by testing similar functions in parallel. Thus, multiple test modes are reduced by using a number of test signals, commonly referred to as a test vector, which is independent of the number of cells in the circuit.

In accordance with an exemplary embodiment, the functionality of a circuit is tested by applying a test vector to a first cell and to at least one additional cell of the circuit in parallel. Accordingly, the time, number of test vectors and cost associated with a functionality test for a circuit can be minimized.

BRIEF DESCRIPTION OF THE DRAWINGS

Other objects and advantages of the present invention will become more apparent from the following detailed description of the preferred embodiments as described in conjunction with the accompanying drawing in which:

FIG. 1 shows a schematic of a circuit having features which permit functionality testing of the circuit.

DETAILED DESCRIPTION OF THE PREFERRED EMBODIMENTS

In the following description of preferred embodiments, particular reference is made to a method and apparatus for testing an integrated circuit, and in particular to the testing of an application specific integrated circuit (ASIC). It will be appreciated, however, that the present invention is not limited to the testing of ASICs. For example, the present invention is equally applicable to any transistor-level circuit, as well as to the testing of a printed circuit board. Further, the invention is equally applicable to any digital or analog circuit.

FIG. 1 shows a diagram of an integrated circuit which includes a first number of similar cells. Each of the similar cells represents, for example, a megafunction, a large functional block, a RAM, a ROM, an ALU or any block of logic down to a single transistor which should be isolated for testing. A preferred method and apparatus for testing the functionality of each of the cells included in the FIG. 1 circuit will now be described.

In FIG. 1, first and second similar cells 2 and 4, respectively are shown. Any number of similar cells may, however be present in a given circuit. In a VLSI or LSI application-specific integrated circuit, each of these cells corresponds to a megacell which includes, for example, a RAM, ROM or arithmetic logic unit (e.g., M×N multipliers, adders, and so forth).

As shown in FIG. 1, the cell 2 has four inputs labelled 6, and the cell 4 has four inputs labelled 8. Similarly, the cell 2 has four outputs labelled 10 while the cell 4 has four outputs labelled 12. The cell 2 is, for example, fabricated on a semiconductor chip and receives inputs over the lines 6 via input pins 14 and pads 16 of the chip. The cell 4 receives inputs over the lines 8. The inputs to the cell 4 are either the signals input to cell 2 or the signals output from cell 2, depending on whether a test mode has been selected.

Chip inputs at the pins 14 are received by level shifters 18 which interface voltage levels of external input signals with the internal operating voltages of a any internal logic, such as logic block 21. Further, the outputs of the cell 2 are connected with gating circuits 20, such as multiplexers, which selectively gate an input signal on one of the given input pins to the inputs of the cell 4.

Other logic and additional cells included in the FIG. 1 integrated circuit are represented by the logic block labelled 21 in FIG. 1. Outputs from the cell 2 in the FIG. 1 circuit are input to the logic block 21, and are therefore not directly accessible at output pins of the chip. Outputs from the cell 4 are, however, both received by inputs to the logic block 21 as well as by gating circuits 22 which, for example, also represent multiplexers for the controllable output of signals from the cell 4 or the logic block 21 to output pins of the chip. An examining means includes outputs of the multiplexers 22 which pass through pad drivers 24 and output pads 26 to pins 28 of the chip. The pad drivers 24 guarantee that operating voltages generated by the FIG. 1 circuit conform with minimum and maximum voltage levels of devices to be driven by output pads 26.

A test block 30 represents an exemplary comparing means which is provided for testing the functionality of the circuit produced on the FIG. 1 chip. The test block 30 includes a plurality of exclusive-NOR, or "XNOR" gates 32, each of which receives outputs from a given type of similar cell included in the circuit. In the FIG. 1 circuit, the XNOR gates 32 thus receive outputs from each of similar cells 2 and 4, respectively.

Outputs of the XNOR gates 32 are fed to an AND gate 34. Because the outputs of each XNOR gate 32 will only become high when both of the respective inputs to the XNOR gate are identical, the XNOR gates effectively compare each of the outputs from the cells 2 and 4. Further, the output of AND gate 34 will only become high when all of the XNOR gate outputs are high. A gating circuit such as a multiplexer 36 receives the output from the AND gate 34, and during a test mode, passes the output from gate 34 to an output error pad 38 via a pad driver 40.

During the test mode, a signal appearing at an output pin 42 of the chip can be used to indicate whether all similar cells of a given type have identical outputs. If an output of one of the similar cells being tested by the test block 30 does not correspond to the same respective output of another cell, then the output at pin 42 of the chip would, for example, be low.

An input pin 44 of the chip, with an associated input pad 46 and level shifter 48 are provided to permit activation of a mode for testing the functionality of the chip. The output of the level shifter 48 passes to each of the multiplexers 20, 22 and 36 to place each of these multiplexers in the test mode.

In normal operation, the cell 4 receives the outputs of cell 2. However, upon activation of the test mode via an input to pin 44, each of the multiplexers 20 responds to a given logic level on pin 44 and enables the inputs on pins 14 to pass to the inputs of cell 4. The output of cell 2 is inhibited from being present on the cell 4 inputs.

Accordingly, both cell 2 and cell 4 will receive the signals which appear on the input pins 14 in the form of a test vector, or test stimuli. If both cells 2 and 4 are properly functioning, they should produce the same outputs on lines 10 and 12, respectively, during the test mode. These outputs are received by the XNOR gates 32 in the test block 30. Assuming proper operation of cells 2 and 4, all XNOR gates 32 will produce a high output, thus sending the output of AND gate 34 high. The output of AND gate 34 is passed to the pad driver 40 since the multiplexer 36 also receives the test mode signal present at input pin 44.

In an exemplary embodiment, an active low input signal is used for initiating a test mode. However, it will be apparent that the circuitry can be designed such that the polarity of the signal (e.g., high or low) used to initiate a test mode can be selected by the designer.

Although all outputs of the first number of similar cells or circuit components can be subject to the same test vector in parallel and a comparison of the outputs from these cells checked via the output pin 42, an error in one of the cells cannot be determined using the output at pin 42 alone. Rather, it is necessary to determine whether all outputs from all similar cells correspond to predetermined, desired outputs associated with a given test vector. Accordingly, during the test mode the multiplexers 22 respond to the input at pin 44 to gate the outputs from a second number (e.g., one) of the similar cells currently being tested to output pins of the chip. In the FIG. 1 circuit, the multiplexers 22 gate the outputs from the cell 4 to output pins 28 where they can be examined.

If during the test mode the outputs on the pins 28 correspond to the desired output for a given cell of the circuit and if during that same test mode the output pin 42 is high, then all cells similar to cell 4 are operating properly. Further, all similar cells will have been tested in parallel via the simultaneous application of the test vectors over input pins 14 to each of the similar cells. As referenced herein, "simultaneous" means that the test vectors associated with the similar cells have been input to the circuit before the outputs of any of these cells have been tested. Thus, as described previously, the time, number of test vectors and cost associated with the functionality testing of a circuit can be reduced considerably.

During the test mode, the various outputs which can be received at pins 28 and 42 corresponding to output pads 26 and 38, respectively, are illustrated in the following table:

| Error Pad (Pin 42) | Tested Function Outputs (Pins 28) | Overall Test |
|---|---|---|
| high | no error | all functions pass |
| low | no error | hidden function(s) fail |
| high | error | tested function fails |
| low | error | function tested definitely fails, hidden function may have also failed |

In this table, the "tested function" refers to the cell whose outputs have been gated to output pins 28 during the test mode. The "hidden function" refers to all other similar cells currently being tested via use of the test block 30. The outputs of a "hidden function" are not examined directly. Rather, the mere existence of a conflict in the circuit due to similar functions producing different outputs during a test mode is indicated by the error pad and output pin 42. Following the indication of an error due to a hidden function (i.e., outputs 28 pass, output 42 fails), each hidden function may, if desired, be isolated using additional logic and separately examined to identify the location of the error.

For example, while not shown in FIG. 1, it may be desirable to isolate any one or all of the hidden functions to permit independent checking of the associated outputs should the test reveal that a hidden function has failed. In this case, additional passive logic can be provided which will allow any or all hidden functions to be multiplexed out should errors need to be diagnosed with specificity.

The polarity of the input to the error pad 38 can also be selected by the user. In the present exemplary embodiment, a high signal in the above table is indicative of "no error". If, for example, the user required that a low signal be present upon occurrence of an error, a NAND gate can be used in place of the AND gate 34.

As can be seen with the FIG. 1 circuit, fewer test modes are required, as only one test mode for each similar block need be run. Accordingly, large multiplexers are not required due to the reduced number of test modes. Further, test logic is primarily passive and is not included in an active logic path such that performance degradation is minimized.

As the number of similar or identical cells included in a circuit increases, the savings in the number of vectors required to test the functionality of the entire circuit layout similarly increases (i.e., for two identical cells, 10,000 vectors instead of 20,000 vectors are required; for five identical cells, 10,000 vectors are required instead of 50,000 vectors). If a device used for testing circuit, i.e., a tester, can run 10,000 vectors a second, then the manufacturing test cost which would result for each test step is significantly reduced.

Further, since functionality tests for a circuit are typically performed when a circuit is implemented as a wafer, three additional times at final implementation and once again during a quality control step of the design phase, the cost savings associated with the overall design phase are significantly reduced. Accordingly, the total cost for manufacturing a properly operating part is reduced.

Since megafunction test vectors are primarily concerned with detecting faults due to manufacturing errors and are executed at, for example, 1 MHz, timing differences are not critical during the above described parallel test. For example, timing differences due to signal propagation through parallel cells often settle within 100 ns while the tester might "strobe" outputs of these cells at approximately 980 ns.

While the present invention has been described using a circuit having two similar cells, it will be appreciated that any number of similar cells or circuit components can be simultaneously tested in parallel. Further, plural test blocks such as test block 30, could be included in a circuit to permit parallel testing of different type cells. This modification would increase the speed of a functionality test, but would be associated with the increased cost of providing plural test blocks, multiplexers and available "test function" output pins for each different type of cell.

For example, in situations where more than two types of cells are to be tested, a number of inputs and outputs can be provided to input all test vectors at once via 2:1 multiplexers. Each type of cell would have a respective error pad and a selected cell whose outputs are multiplexed to outputs of the chip for examination. In this case, a single test mode can be used to gate the test vectors for each of the different types of cells. Alternately, the test vectors for each type of cell can be run in sequential test modes using multiplexers to select the cells to be tested during each sequential test mode.

It will be appreciated that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description, and all the changes that come within the meaning and range and equivalents thereof are intended to be embraced therein.

What is claimed is:

1. A method for testing the functionality of a circuit having a normal mode of operation and a test mode of operation comprising the steps of:
   producing a test vector for testing functionality of a first cell included in the circuit;
   applying the test vector during the test mode to a first number of cells included in the circuit, said first number of cells including at least the first cell and at least one additional cell of the circuit in parallel; and
   examining an output from a second number of said cells less than said first number of cells during said test mode to verify that said first number of cells produces a desired output in response to said test vector.

2. Method for testing the functionality of a circuit having a normal mode of operation and a test mode of operation comprising the steps of:

inputting a test vector to the circuit;
applying said test vector to inputs of a first number of a plurality of circuit components in said circuit having similar characteristics;
comparing outputs of the first number of circuit components with one another to produce a first test signal;
examining at least a second test signal produced by outputs of a second number of said circuit components less than said first number of said circuit components; and,
analyzing the first and second test signals to determine functionality of the circuit.

3. A method for testing the functionality of a circuit having at least two circuit components comprising the steps of:
providing at least one test vector for a first number of a plurality of circuit components to be tested, such that a total number of test vectors is less than the first number of circuit components; and
analyzing circuit output signals generated in response to said at least one test vector to determine whether said circuit is properly functioning by examining an output from a second number of circuit components, less than said first number of circuit components, during said test mode to verify that said first number of circuit components produces a desired output in response to said at least one test vector.

4. Method according to claim 3, wherein said step of analyzing further includes the step of:
comparing output signals of at least two circuit components with one another.

5. Method according to claim 3, wherein said steps of providing and analyzing are repeated for each type of circuit component.

6. Method according to claim 5, wherein the test vectors associated with each type of circuit component are sequentially input to the circuit.

7. Method according to claim 5, wherein the test vectors associated with each type of circuit component are input to the plurality of circuit components at one time.

8. Method according to claim 3, wherein the circuit is an integrated circuit.

9. Method according to claim 3, wherein said steps of providing and analyzing are performed during a simulation of said circuit.

10. Method according to claim 3, wherein said steps of providing and analyzing are performed during manufacture of said circuit.

11. Method according to claim 3, wherein the circuit is formed as a printed circuit board.

12. Apparatus for testing the functionality of a circuit comprising:
means for applying a test signal to inputs of a first number of a plurality of circuit components of a circuit during a test mode;
means for comparing outputs of said first number of a plurality of circuit components to produce a first test output signal in response to said test signal; and,
means for examining an output of a second number of said plurality of circuit components, said second number being less than said first number, during said test mode to verify that said first number of circuit component produces a desired output in response to said test signal.

13. Apparatus according to claim 12, wherein the functionality of the circuit is tested using a number of test signals which is independent of the first number of the plurality of circuit components to be tested.

14. Apparatus according to claim 12, wherein said means for applying includes at least one multiplexer.

15. Apparatus according to claim 12, wherein test signals are sequentially applied to the circuit for each different type of circuit component.

16. Apparatus according to claim 15, wherein said means for applying includes a 2:1 multiplexer.

17. Apparatus according to claim 12, wherein said means for comparing includes at least one exclusive NOR gate and at least one AND gate.

18. Apparatus according to claim 12, wherein said means for examining enables the outputs of any given circuit component to be selectively directed to output pins of the circuit for individual analysis.

19. Apparatus according to claim 12, wherein said means for applying and said means for examining enable the circuit to be operated in a normal mode and a test mode.

* * * * *